(12) United States Patent
Shah et al.

(10) Patent No.: US 7,989,339 B2
(45) Date of Patent: *Aug. 2, 2011

(54) VAPOR DEPOSITION PROCESSES FOR TANTALUM CARBIDE NITRIDE MATERIALS

(75) Inventors: Kavita Shah, Mountain View, CA (US); Haichun Yang, Santa Clara, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/699,271

(22) Filed: Feb. 3, 2010

(65) Prior Publication Data

US 2010/0129535 A1    May 27, 2010

Related U.S. Application Data

(63) Continuation of application No. 11/860,952, filed on Sep. 25, 2007, now Pat. No. 7,678,298.

(51) Int. Cl.
*H01L 21/4763* (2006.01)

(52) U.S. Cl. ........ 438/627; 438/635; 438/638; 438/648; 438/653; 438/687; 438/637; 438/643; 438/656; 257/163; 257/E21.17; 427/535; 427/248.1

(58) Field of Classification Search .................. 438/648, 438/627, 635, 638, 643, 653, 656, 685, 687; 427/535, 248.1; 257/163, E21.17
See application file for complete search history.

(56) References Cited

U.S. PATENT DOCUMENTS

| | | | |
|---|---|---|---|
| 6,229,211 | B1 | 5/2001 | Kawanoue et al. |
| 6,518,177 | B1 | 2/2003 | Kawanoue et al. |
| 6,624,073 | B2 | 9/2003 | Sun et al. |
| 6,905,541 | B2 | 6/2005 | Chen et al. |
| 7,585,762 | B2 | 9/2009 | Shah et al. |
| 2007/0054047 | A1 | 3/2007 | Ishizaka et al. |
| 2007/0218683 | A1* | 9/2007 | Ishizaka et al. ............... 438/648 |
| 2007/0284670 | A1 | 12/2007 | Yamamoto et al. |
| 2008/0290416 | A1 | 11/2008 | Yu et al. |

* cited by examiner

*Primary Examiner* — Harold Y Pyon
*Assistant Examiner* — Timothy Chiang
(74) *Attorney, Agent, or Firm* — Patterson & Sheridan, L.L.P.

(57) ABSTRACT

Embodiments of the invention generally provide methods for depositing and compositions of tantalum carbide nitride materials. The methods include deposition processes that form predetermined compositions of the tantalum carbide nitride material by controlling the deposition temperature and the flow rate of a nitrogen-containing gas during a vapor deposition process, including thermal decomposition, CVD, pulsed-CVD, or ALD. In one embodiment, a method for forming a tantalum-containing material on a substrate is provided which includes heating the substrate to a temperature within a process chamber, and exposing the substrate to a nitrogen-containing gas and a process gas containing a tantalum precursor gas while depositing a tantalum carbide nitride material on the substrate. The method further provides that the tantalum carbide nitride material is crystalline and contains interstitial carbon and elemental carbon having an interstitial/elemental carbon atomic ratio of greater than 1, such as about 2, 3, 4, or greater.

19 Claims, 3 Drawing Sheets

VAPOR DEPOSITION PROCESSES FOR TANTALUM CARBIDE NITRIDE MATERIALS

CROSS-REFERENCE TO RELATED APPLICATIONS

This application is a continuation application of U.S. patent application Ser. No. 11/860,952, filed Sep. 25, 2007, which is herein incorporated by reference. This application is related to U.S. patent application Ser. No. 11/860,945, filed Sep. 25, 2007, now issued as U.S. Pat. No. 7,585,762, which is herein incorporated by reference.

BACKGROUND OF THE INVENTION

1. Field of the Invention

Embodiments of the invention generally relate to electronic device processing, and more particularly, to vapor deposition processes for tantalum-containing materials and the compositions of the tantalum-containing materials, such as tantalum carbide nitride materials.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises.

Several areas of fabrication that are constantly improving include the formation of metal gate electrodes and the deposition of contact barrier layers. Gate electrodes have often been made with silicon based materials, but more frequently are made with metallic materials, such as tungsten or cobalt. However, the materials used for gate electrodes have lacked accessible or tunable electronic properties by varying the compositions of the contained materials. While tantalum materials have been used as barrier layers, tantalum materials have only been scarcely used for the formation of metal gate electrodes, despite the variety of electronic characteristics available from tantalum materials.

Formation of tantalum-containing barrier layers, such as tantalum, tantalum nitride, and other tantalum materials, in multi-level integrated circuits poses many challenges to process control, particularly with respect to contact formation. Contacts are formed by depositing conductive interconnect material in an opening (e.g., via) on the surface of insulating material disposed between two spaced-apart conductive layers. Copper, tungsten, and aluminum are the most popular conductive interconnect materials, but may diffuse into neighboring layers, such as dielectric layers. The resulting and undesirable presence of these metals causes dielectric layers to become conductive and ultimate device failure. Therefore, barrier materials are used to control metal diffusion into neighboring materials.

Barrier layers formed from sputtered tantalum and reactive sputtered tantalum nitride have demonstrated properties suitable for use to control metal diffusion. Exemplary properties include high conductivity, high thermal stability, and resistance to diffusion of foreign atoms. Physical vapor deposition (PVD) processes are used to deposit tantalum materials as gate electrodes or in features of small size (e.g., about 90 nm wide) and high aspect ratios of about 5:1. However, it is believed that PVD processes may have reached a limit at this size and aspect ratio. Also, the variety of compositions for tantalum materials is very limited when using a PVD process.

Attempts have been made to use traditional tantalum precursors found in chemical vapor deposition (CVD) or atomic layer deposition (ALD) processes to deposit tantalum materials. Multiple CVD and ALD processes are anticipated to be used in the next generation technology of 45 nm wide features having aspect ratios of about 10:1 or greater. Also, ALD processes more easily deposit tantalum materials on features containing undercuts than does PVD processes. Formation of tantalum-containing films from CVD or ALD processes using $TaCl_5$ as a precursor may require as many as three treatment cycles using various radial based chemistries (e.g., atomic hydrogen or atomic nitrogen) to form tantalum materials. Processes using $TaCl_5$ may also suffer from chlorine contaminants within the tantalum material. While metal-organic tantalum precursors may be used to form tantalum materials containing no chlorine contaminants, the deposited materials may suffer with the undesirable characteristic of a high carbon content.

Therefore, there is a need for a process to deposit tantalum-containing materials, such as tantalum carbide nitride, on a substrate, including as a metal gate electrode as well as a barrier layer, while controlling process parameters in order to form predetermined compositions having select electronic properties.

SUMMARY OF THE INVENTION

Embodiments of the invention generally provide methods for depositing a tantalum-containing material, such as a tantalum carbide nitride material, onto a substrate, as well as for compositions of the tantalum carbide nitride material. The methods include deposition processes that form predetermined compositions of the tantalum carbide nitride material by controlling the deposition temperature and the flow rate of a nitrogen-containing gas during a vapor deposition process. The deposition process may include thermal decomposition processes, chemical vapor deposition (CVD) processes, pulsed CVD processes, atomic layer deposition (ALD) processes, as well as plasma enhanced (PE) processes, such as PE-CVD and PE-ALD.

In one embodiment, a method for forming a tantalum-containing material on a substrate is provided which includes heating a substrate to a temperature within a process chamber, and exposing the substrate to a nitrogen-containing gas and a process gas containing a tantalum precursor gas while depositing a tantalum carbide nitride material on the substrate. The method further provides that the tantalum carbide nitride material is crystalline and contains interstitial carbon and elemental carbon having an interstitial/elemental carbon atomic ratio of about 2 or greater, in some examples, about 3 or greater, and in other examples, about 4 or greater.

In another embodiment, a method for forming a tantalum-containing material on a substrate is provided which includes heating a substrate to a predetermined temperature within a process chamber, and exposing the substrate to a nitrogen-containing gas and a tantalum precursor gas while depositing a tantalum carbide nitride material on the substrate, and the tantalum carbide nitride material has the chemical formula of $TaC_xN_y$, wherein x is within a range from about 0.20 to about 0.50 and y is within a range from about 0.20 to about 0.55. In another example, x may be within a range from about 0.25 to about 0.40 and y is within a range from about 0.40 to about 0.50. Also, the tantalum carbide nitride material may have a sheet resistance within a range from about $1 \times 10^4$ Ω/sq to about $1 \times 10^6$ Ω/sq.

Embodiments are provided in which the flow rate of the nitrogen-containing gas is adjusted to obtain the interstitial/ elemental carbon atomic ratio. For example, the flow rate of the nitrogen-containing gas may be adjusted to about 1,500 sccm or less, such as within a range from about 100 sccm to about 1,000 sccm. In some examples, the nitrogen-containing gas and the process gas containing the tantalum precursor gas are exposed to the substrate at a gaseous flow rate ratio of at least about 1:1. Other examples provide that the gaseous flow rate ratio is at least about 3:1 or 5:1. The temperature of the substrate may be within a range from about 250° C. to about 600° C., preferably, from about 350° C. to about 550° C., and more preferably, from about 400° C. to about 500° C. In one example, the nitrogen-containing gas contains ammonia. In other embodiments, the nitrogen-containing gas may contain amines or hydrazines.

In one specific example, a method for forming a tantalum-containing material on a substrate is provided which includes heating a substrate to a temperature within a range from about 400° C. to about 500° C., and exposing the substrate to a nitrogen-containing gas and a tantalum precursor gas comprising tertbutylimido-tris(ethylmethylamido)tantalum (TBTEMT) while depositing a tantalum carbide nitride material on the substrate, wherein the tantalum carbide nitride material is crystalline and contains an interstitial/elemental carbon atomic ratio of about 2 or greater.

The tantalum precursor gas may contain an alkylamido tantalum compound, and may contain a carrier gas. The alkylamido tantalum compound may be tertbutylimido-tris(ethylmethylamido)tantalum, tertbutylimido-tris(diethylamido)tantalum (TBTDEAT), tertbutylimido-tris(dimethylamido)tantalum (TBTDMAT), tertiaryamylimido-tris(dimethylamido)tantalum (TAIMATA), tertiaryamylimido-tris(diethylamido)tantalum, tertiaryamylimido-tris(methylethylamido)tantalum, pentakis(ethylmethylamido)tantalum (PEMAT), pentakis(diethylamido)tantalum (PDEAT), pentakis(dimethylamido)tantalum (PDMAT), plasmas thereof, derivatives thereof, or combinations thereof. In many examples, the alkylamido tantalum compound is tertbutylimido-tris(ethylmethylamido)tantalum. In some embodiments, the process gas contains ammonia, nitrogen gas ($N_2$), hydrogen gas ($H_2$), plasmas thereof, derivatives thereof, or combinations thereof. In other embodiments, the process gas may further contain a hydrocarbon gas to help regulate the carbon concentration. The hydrocarbon gas may be methane, ethane, propane, butane, ethene, acetylene, butene, butyne, plasmas thereof, derivatives thereof, or combinations thereof.

In another embodiment, a composition of a tantalum carbide nitride material is provided which includes a chemical formula of $TaC_xN_y$, wherein x is within a range from about 0.20 to about 0.50 and y is within a range from about 0.20 to about 0.55, an interstitial/elemental carbon atomic ratio of about 2 or greater, and a crystalline structure. In some examples, the composition of the tantalum carbide nitride material provides that x is within a range from about 0.25 to about 0.40 and y is within a range from about 0.30 to about 0.50 or in other examples, x is within a range from about 0.30 to about 0.40 and y is within a range from about 0.35 to about 0.50. In other examples, the composition of the tantalum carbide nitride material provides that the interstitial/elemental carbon atomic ratio is about 3, 4 or greater within the tantalum carbide nitride material. The tantalum carbide nitride material may have a sheet resistance within a range from about $1 \times 10^4$ Ω/sq to about $1 \times 10^6$ Ω/sq. In some examples, the tantalum carbide nitride material may contain silicon or boron.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

Embodiments of the invention provide a deposition process for depositing a tantalum-containing material, namely, a tantalum carbide nitride material, onto a substrate. The composition of the tantalum carbide nitride material may be controlled by adjusting the flow rate of a nitrogen-containing gas during the deposition process. Also, by adjusting the temperature of the substrate, the composition of the tantalum carbide nitride material may be controlled during the deposition process. The deposition process includes thermal decomposition processes, chemical vapor deposition (CVD) processes, pulsed CVD processes, atomic layer deposition (ALD) processes, as well as plasma enhanced (PE) processes, such as PE-CVD and PE-ALD.

In one example, the deposition process employs an alkylamido tantalum compound as the tantalum precursor, such as tertbutylimido-tris(ethylmethylamido)tantalum (TBTEMT) and ammonia as the nitrogen-containing gas. In one embodiment, the deposited tantalum carbide nitride material may have the chemical formula of $TaC_xN_y$, wherein x is within a range from about 0.20 to about 0.50 and y is within a range from about 0.20 to about 0.55, an interstitial/elemental carbon atomic ratio of about 2 or greater, and a crystalline structure. In some examples, the composition of the tantalum carbide nitride material provides that x is within a range from about 0.25 to about 0.40 and y is within a range from about 0.40 to about 0.50. In other examples, the composition of the tantalum carbide nitride material provides that the interstitial/elemental carbon atomic ratio is about 3, 4 or greater within the tantalum carbide nitride material.

Figure 1:
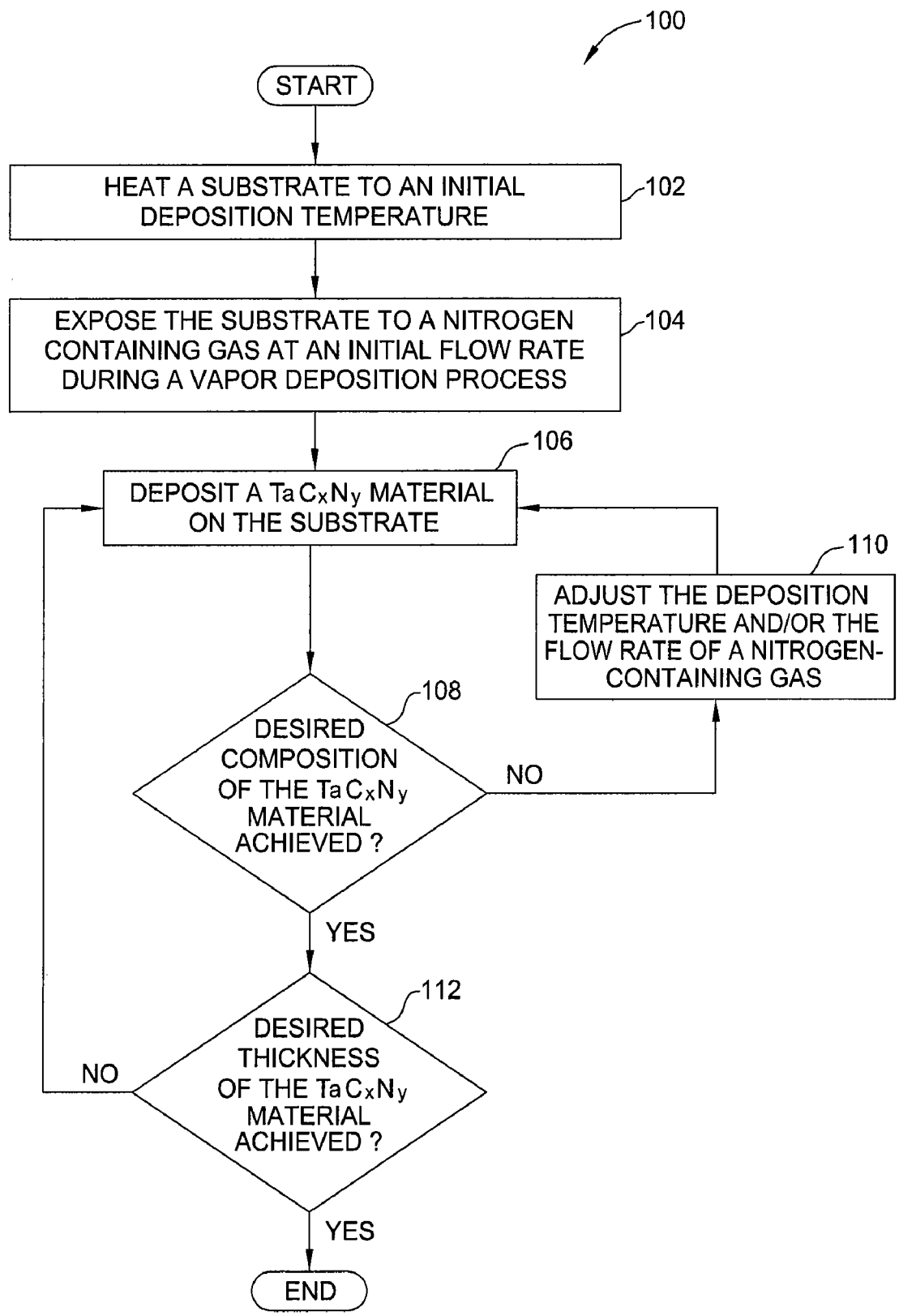
FIG. 1 illustrates a flow diagram showing a method of depositing a tantalum carbide nitride material in accordance with embodiments described herein.

FIG. 1 illustrates a flow chart depicting process 100 that may be used to form a tantalum carbide nitride material. During step 102, a substrate is heated to an initial deposition temperature within a process chamber. The substrate is subsequently exposed to a nitrogen-containing gas (e.g., ammonia) that has an initial flow rate at step 104. The tantalum carbide nitride material is deposited on the substrate while the nitrogen-containing gas is being exposed to the substrate during step 106. The tantalum carbide nitride material may be deposited by a deposition process, such as thermal decomposition, CVD, pulsed-CVD, PE-CVD, ALD, PE-ALD, or derivatives thereof during step 106. At step 108, if the desired composition of the tantalum carbide nitride material is not achieved, then the process continues to step 110, where the adjustments are made to deposition temperature and/or the flow rate of the nitrogen-containing gas before proceeding back to step 106. However, if the desired composition is achieved, then the process continues to step 112. At step 112, if the desired thickness of the tantalum carbide nitride material is not achieved, then the process proceeds back to step 106. However, process 100 is over after achieving the desired thickness of the tantalum carbide nitride material.

In step 102, a substrate is positioned within a process chamber and heated to an initial deposition chamber. The substrate may be heated to a temperature within a range from about 250° C. to about 600° C., preferably, from about 350° C. to about 525° C., and more preferably, from about 400° C. to about 500° C. The process chamber has a controlled environment that is pressurized within a range from about 1 mTorr to about 100 Torr, preferably, from about 1 Torr to about 10 Torr, and more preferably, from about 2 Torr to about 5 Torr.

In step 104, the substrate is exposed to a nitrogen-containing gas that has an initial flow rate. The nitrogen-containing gas may be used to deposit tantalum-containing materials, such as tantalum carbide nitride materials. A nitrogen-containing gas or nitrogen precursor may include, ammonia ($NH_3$), hydrazine ($N_2H_4$), methyl hydrazine (($CH_3)HN_2H_2$), dimethyl hydrazine (($CH_3)_2N_2H_2$), t-butylhydrazine ($C_4H_9N_2H_3$), phenylhydrazine ($C_6H_5N_2H_3$), other hydrazine derivatives, amines, a nitrogen plasma source (e.g., $N_2$, $N_2/H_2$, $NH_3$, or $N_2H_4$ plasmas), 2,2'-azotertbutane (($CH_3)_6C_2N_2$), organic or alkyl azides, such as methylazide ($CH_3N_3$), ethylazide ($C_2H_5N_3$), trimethylsilylazide ($Me_3SiN_3$), inorganic azides (e.g., $NaN_3$ or $Cp_2CoN_3$), and other suitable nitrogen sources. Radical nitrogen compounds can be produced by heat, hot-wires and/or plasma, such as $N_3$, $N_2$, N, NH, or $NH_2$. In many examples, the nitrogen-containing gas contains ammonia. The nitrogen-containing gas may have a flow rate within a range from about 50 sccm to about 2,000 sccm, preferably, from about 100 sccm to about 1,500 sccm. In various examples, the nitrogen-containing gas may have a flow rate of about 100 sccm, 500 sccm, 1,000 sccm or 1,500 sccm.

In step 106, the tantalum carbide nitride material is deposited on the substrate while the nitrogen-containing gas is being exposed to the substrate. During step 106, the tantalum carbide nitride material may be deposited by a thermal decomposition process, a CVD process, a pulsed-CVD process, a PE-CVD process, an ALD process, a PE-ALD process, or derivatives thereof.

In one embodiment, the tantalum carbide nitride material may be deposited by exposing a substrate to a tantalum precursor gas formed by vaporizing the precursor TBTEMT. "TBTEMT" is used herein to describe tertiary-butylimido-tris(ethylmethylamido)tantalum with the chemical formula ($^tBuN)Ta(NEtMe)_3$, wherein $^tBu$ is the tertiarybutly group ($C_4H_9$— or ($CH_3)_3C$—). A tantalum precursor gas may be formed by heating a TBTEMT precursor in a vaporizer, a bubbler, or an ampoule to a temperature of at least 50° C., preferably, to a temperature within a range from about 65° C. to about 90° C. A carrier gas (e.g., $N_2$ or Ar) is flown across or bubbled through the heated TBTEMT to form a tantalum precursor gas.

An important precursor characteristic is to have a favorable vapor pressure. Deposition precursors may have gas, liquid or solid states at ambient temperature and pressure. However, within the process chamber, precursors may be volatilized as gas. Precursors are usually heated prior to delivery into the process chamber.

Although TBTEMT is one of the tantalum precursors that may be utilized during the deposition process in step 106, other tantalum precursors may be heated to form tantalum precursor gases and used to deposit tantalum carbide nitride materials as described herein. Tantalum precursors may contain ligands such as alkylamidos, alkylimidos, cyclopentadienyls, halides, alkyls, alkoxides, or combinations thereof. Alkylamido tantalum compounds used as tantalum precursors include ($RR'N)_5Ta$, where R or R' are independently hydrogen or an alkyl group, such as methyl, ethyl, propyl, butyl, or pentyl (amyl). Alkylimido tantalum compounds used as tantalum precursors include alkylimido, tris-alkylamido tantalum compounds, such as ($R''N)(R'RN)_3Ta$, where R, R', or R" are independently hydrogen or an alkyl group, such as methyl, ethyl, propyl, butyl, or pentyl. Specific tantalum precursors may include ($^tAmylN)Ta(NMe_2)_3$ (TAIMATA), ($^tAmylN)Ta(NEt_2)_3$, ($^tAmylN)Ta(NMeEt)_3$, ($^tBuN)Ta(NMe_2)_3$ (TBTMT), ($^tBuN)Ta(NEt_2)_3$ (TBTET), ($^tBuN)Ta(NEtMe)_3$, ($Et_2N)_5Ta$ (PDEAT), ($Me_2N)_5Ta$ (PDMAT), ($EtMeN)_5Ta$ (PEMAT), derivatives thereof. In many examples, the tantalum precursor contains an amylimido compound, such as TBTEMT or TAIMATA during the formation or deposition of the tantalum carbide nitride material by thermal decomposition, CVD, pulsed-CVD, PE-CVD, ALD, or PE-ALD. "TAIMATA" is used herein to describe the liquid precursor tertiaryamylimido-tris(dimethylamido)tantalum with the chemical formula ($^tAmylN)Ta(NMe_2)_3$, wherein $^tAmyl$ is the tertiaryamyl group ($C_5H_{11}$— or $CH_3CH_2C(CH_3)_2$—). The substrate may be exposed to a process gas that includes the tantalum precursor gas and a carrier gas. Herein, the carrier gas and/or the purge gas may be argon, nitrogen, hydrogen, helium, forming gas ($N_2/H_2$), or combinations thereof.

Reducing agents and other reactive gases may be used to deposit tantalum-containing materials within the deposition process during step 106. In one embodiment, the tantalum-containing materials are the tantalum carbide nitride materials. However, in other embodiments, the tantalum-containing materials may contain silicon, boron, phosphorous, hydrogen, and other elements, as well as carbon and nitrogen. To achieve a predetermined concentration of carbon in a deposited tantalum-containing material, additional carbon-containing compounds or carbon precursors may be incorporated within the deposition process during step 106. Carbon precursors may include methane, ethane, ethene, ethyne, propane, propene, propyne, butane, hexane, heptane, octane, nonane, decane, derivatives thereof, or combinations thereof.

Silicon-containing compounds or silicon precursors may be used to deposit tantalum-containing materials, such as tantalum silicide carbide nitride, tantalum silicide nitride, tantalum silicide carbide, or tantalum silicide. Silicon precursors include silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Organosilanes include compounds with the empirical formula $R_ySi_xH_{(2x+2-y)}$, where R is independently methyl, ethyl, propyl or butyl, such as methylsilane (($CH_3)SiH_3$), dimethylsilane (($CH_3)_2SiH_2$), ethylsilane (($CH_3CH_2)SiH_3$), methyldisilane (($CH_3)Si_2H_5$), dimethyldisilane (($CH_3)_2Si_2H_4$) and hexamethyldisilane (($CH_3)_6Si_2$). Exemplary silicon precursors include silane, disilane, or methylsilane.

Boron-containing compounds or boron precursors may be used to deposit tantalum-containing materials, such as tantalum boride carbide nitride, tantalum boride nitride, tantalum boride carbide, or tantalum boride. Boron precursors include boranes and organoboranes, which include borane ($BH_3$), diborane ($B_2H_6$), triborane ($B_3H_8$), tetraborane ($B_4H_{10}$), trimethylborane (($CH_3)_3B$), triethylborane (($CH_3CH_2)_3B$), or derivatives thereof. Exemplary boron precursors include diborane and trimethylborane.

The composition of the tantalum carbide nitride material is determined during step 108 prior to the advancing to either step 110 or step 112. If the desired composition has not been obtained, process 100 proceeds to step 110 to adjust the particular process perimeters (e.g., deposition temperature and/or flow rate of nitrogen-containing gas) in order to achieve the desired composition. Alternatively, once the process perimeters are calibrated to obtain the desired composition of the tantalum carbide nitride material, process 100 progresses to step 112.

In one embodiment, the tantalum carbide nitride material may be deposited having a crystalline structure, such that two forms of carbon are incorporated within the tantalum carbide nitride material. The crystalline tantalum carbide nitride may have interstitial carbon, which is covalently bonded to tantalum and nitrogen atoms, and is interstitially positioned within at lattice sites of the crystalline structure. The crystalline tantalum carbide nitride may also have elemental carbon, which is physically incorporated (not covalently bonded) to tantalum and nitrogen atoms, and is positioned outside if the at lattice sites of the crystalline structure.

Embodiments provide that the tantalum carbide nitride material may be deposited having an interstitial/elemental carbon atomic ratio of about 2 or greater. In some examples, the composition of the tantalum carbide nitride material provides that the interstitial/elemental carbon atomic ratio is about 3, 4, or greater within the tantalum carbide nitride material. Also, the carbon and nitrogen concentrations may be varied so that the tantalum carbide nitride material has a sheet resistance within a range from about $1 \times 10^4$ Ω/sq to about $1 \times 10^6$ Ω/sq.

In another embodiment, the tantalum carbide nitride material is formed or deposited with a chemical formula of $TaC_xN_y$, wherein x is within a range from about 0.20 to about 0.50 and y is within a range from about 0.20 to about 0.55. In some examples, x may be within a range from about 0.25 to about 0.40 and y may be within a range from about 0.40 to about 0.50.

During step 110, the deposition temperature, as well as the flow rate of a nitrogen-containing gas may be adjusted in order to obtain the desired composition of the tantalum carbide nitride material. Thereafter, the deposition process in step 106 is repeated to form the tantalum carbide nitride material. The deposition temperature may be adjusted during the deposition process, such as thermal decomposition, CVD processes, or ALD processes. The deposition temperature may be increased in order to lower the carbon concentration within the tantalum carbide nitride material. Alternatively, the deposition temperature may be lowered in order to increase the carbon concentration within the tantalum carbide nitride material. In one embodiment, the temperature of the substrate or the substrate pedestal during step 106 may be within a range from about 250° C. to about 600° C., preferably, from about 350° C. to about 550° C., and more preferably, from about 400° C. to about 500° C.

In another embodiment, the flow rate of the nitrogen-containing gas may also be adjusted to obtain the desired composition of the tantalum carbide nitride material, such as a specific interstitial/elemental carbon atomic ratio. The nitrogen-containing gas is administered during the deposition process, such as thermal decomposition, CVD processes, or ALD processes. The flow rate of the nitrogen-containing gas may be adjusted to about 4,000 sccm or less, such as within a range from about 100 sccm to about 4,000 sccm, preferably, from about 300 sccm to about 3,000 sccm, and more preferably, from about 1,000 sccm to about 2,000 sccm. The flow rate of the tantalum precursor gas may be adjusted to about 1,000 sccm or less, such as within a range from about 50 sccm to about 2,000 sccm, preferably, from about 100 sccm to about 1,000 sccm, and more preferably, from about 300 sccm to about 700 sccm.

The flow rate of the nitrogen-containing gas relative to the flow rate of the tantalum precursor gas may have a gaseous flow rate ratio of about 1:1, 2:1, 3:1, 4:1, 5:1, or higher. The gaseous flow rate ratio may be increased in order to lower the carbon concentration within the tantalum carbide nitride material. Alternatively, the gaseous flow rate ratio may be lowered in order to increase the carbon concentration within the tantalum carbide nitride material. The tantalum precursor gas contains a vaporized tantalum precursor and usually contains a carrier gas. The carrier gas may be argon, nitrogen, hydrogen, helium, forming gas, or combinations thereof. In one example, the substrate is exposed to a nitrogen-containing gas of ammonia having a flow rate of about 1,250 sccm and a tantalum precursor gas of TBTEMT and argon having a flow rate of about 500 sccm during a thermal decomposition process having a gaseous flow rate ratio of about 2.5:1. In another example, the substrate is exposed to a nitrogen-containing gas of ammonia having a flow rate of about 1,500 sccm and a tantalum precursor gas of PDMAT and argon having a flow rate of about 500 sccm during a thermal decomposition process having a gaseous flow rate ratio of about 3:1.

The thickness of the tantalum carbide nitride material may be determined during step 112. If the desired thickness has not been obtained, process 100 reverts back to the deposition process in step 106 in order to achieve the desired thickness. Process 100 is stopped once the desired thickness of the tantalum carbide nitride material has been formed on the substrate. The overall thickness of the tantalum carbide nitride material is dependent on the specific requirements of the fabrication application. For example, the tantalum carbide nitride material may be deposited to form a tantalum-containing gate electrode that has a thickness within a range from about 10 Å to about 1,000 Å, preferably, from about 40 Å to about 200 Å. In another example, the tantalum carbide nitride material may be deposited to form a tantalum-containing barrier layer that has a thickness within a range from about 3 Å to about 200 Å, preferably, from about 5 Å to about 100 Å, and more preferably, from about 10 Å to about 50 Å.

Figure 2A:
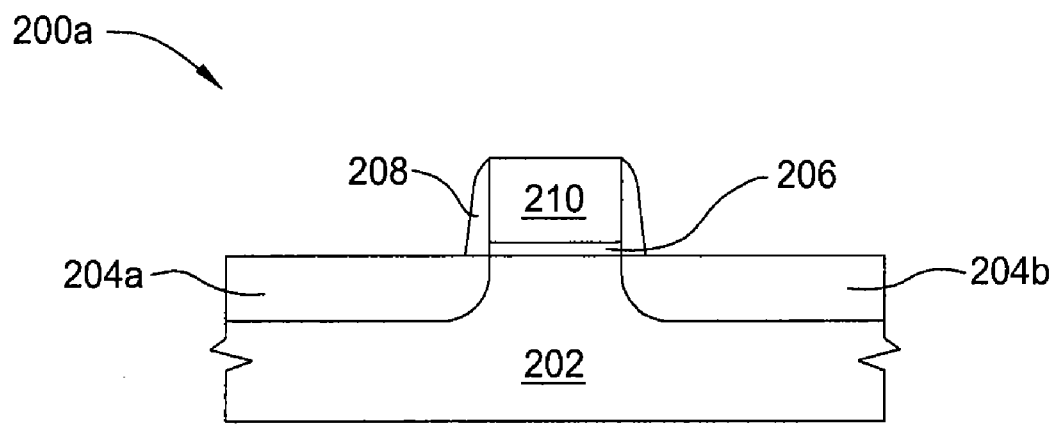
FIGS. 2A-2B depict cross-sectional views of substrates containing tantalum carbide nitride materials used as gate electrodes in accordance with embodiments described herein.

In one embodiment, FIG. 2A depicts tantalum-containing gate electrode 210 containing a tantalum carbide nitride material deposited by methods described herein on substrate 200a, which may be used in a Logic application. Substrate 200a contains source layer 204a and drain layer 204b deposited or formed on layer 202, which may be the substrate surface or a dielectric layer disposed thereon. In one example, source layer 204a and drain layer 204b may be formed by implanting ions into layer 202. The segments of source layer 204a and drain layer 204b are bridged by tantalum-containing gate electrode 210 formed on gate insulting layer 206. An off-set layer or spacer 208 may be deposited on both sides of tantalum-containing gate electrode 210. Gate insulting layer 206 may contain a dielectric material such as hafnium oxide, hafnium silicate, hafnium silicon oxynitride, aluminates thereof, or derivatives thereof. Spacer 208 may contain silicon nitride, silicon oxynitride, derivatives thereof, or combinations thereof.

Figure 2B:
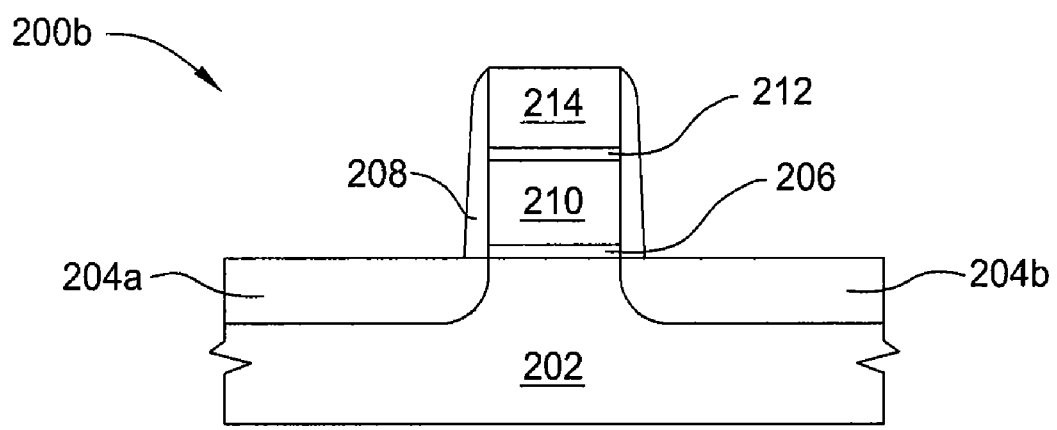

In another embodiment, FIG. 2B depicts tantalum-containing gate electrode 210 containing a tantalum carbide nitride material deposited by methods described herein on substrate 200b, which may be used in a Flash application. Substrate 200b may share most of the features as substrate 200a, but also contains tantalum-containing gate electrode 214, a gate control layer, deposited on isolation layer 212 which is disposed on tantalum-containing gate electrode 210. Tantalum-containing gate electrode 214 may contain a tantalum carbide nitride material deposited by methods described herein. Isolation layer 212 may contain an oxynitride, such as an oxide-nitride (ON) layered material or an oxide-nitride-oxide (ONO) layered material, a silicon nitride (SiN) layered material, or a silicide, such as tantalum silicide.

The tantalum carbide nitride material contained within tantalum-containing gate electrodes 210 or 214 may be formed or deposited by a thermal decomposition process, a CVD process, a pulsed-CVD process, a PE-CVD process, an ALD process, a PE-ALD process, or derivatives thereof. In some examples, a tantalum precursor that contains ligands such as alkylamidos and/or alkylamidos is used during the deposition process along with a nitrogen-containing gas. In one example, the deposition process utilizes TBTEMT as the tantalum precursor and ammonia as the nitrogen-containing gas. The tantalum carbide nitride material may be deposited to form tantalum-containing gate electrodes 210 or 214 having a thickness within a range from about 10 Å to about 1,000 Å, preferably, from about 40 Å to about 200 Å.

In one example, the tantalum carbide nitride material has a crystalline structure, such that the interstitial carbon and the elemental carbon have an interstitial/elemental carbon atomic ratio of about 2 or greater, preferably, about 3 or greater, and more preferably, about 4 or greater within tantalum-containing gate electrodes 210 and 214. The tantalum carbide nitride material may be deposited having a desired composition by adjusting the nitrogen-containing gas flow rate or the temperature of substrate 200a during the deposition process. In one example, the tantalum carbide nitride material is formed with a chemical formula of $TaC_xN_y$, wherein x is within a range from about 0.20 to about 0.50 and y is within a range from about 0.20 to about 0.55, preferably, x may be within a range from about 0.25 to about 0.40 and y may be within a range from about 0.40 to about 0.50.

Tantalum-containing gate electrodes 210 or 214 may each have a varied composition to better control the work function, such as the work function of tantalum-containing gate electrode 210 between source layer 204a and drain layer. Tantalum-containing gate electrodes 210 and 214 contain tantalum, carbon, nitrogen and optionally may contain silicon, boron, phosphorus, or combinations thereof. In many examples, tantalum-containing gate electrodes 210 or 214 contain tantalum carbide nitride with a sheet resistance within a range from about $1 \times 10^4$ Ω/sq to about $1 \times 10^6$ Ω/sq. However, the work function of tantalum-containing gate electrodes 210 or 214 may be adjusted to be less resistive by increasing the nitrogen concentration and/or decreasing the carbon concentration relative to the tantalum concentration. In one example, tantalum-containing gate electrodes 210 or 214 contains tantalum carbide nitride with a sheet resistance of greater than about $1 \times 10^5$ Ω/sq, preferably, about $1 \times 10^6$ Ω/sq or greater. Alternatively, the work function of tantalum-containing gate electrodes 210 or 214 may be adjusted to be more resistive by decreasing the nitrogen concentration and/or increasing the carbon concentration relative to the tantalum concentration. In another example, tantalum-containing gate electrodes 210 or 214 contains tantalum carbide nitride with a sheet resistance of less than about $1 \times 10^6$ Ω/sq, preferably, about $1 \times 10^4$ Ω/sq or less.

Figure 3:
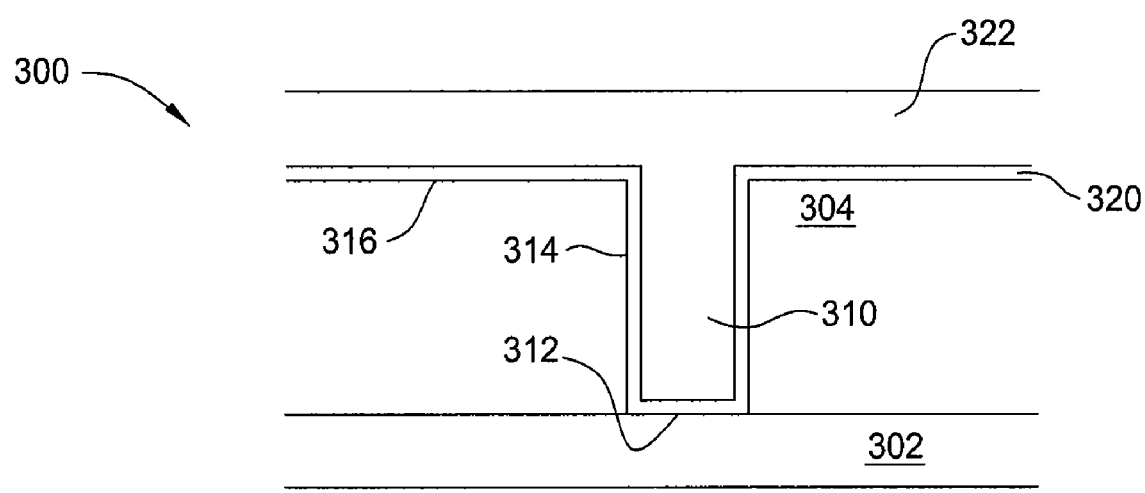
FIG. 3 depicts a cross-sectional view of another substrate containing a tantalum carbide nitride material used as a barrier layer in accordance with other embodiments described herein.

In another embodiment, FIG. 3 depicts substrate 300 having an exemplary structure upon which a tantalum carbide nitride material may be deposited as tantalum-containing barrier layer 320. Substrate 300 contains lower layer 302 that may be one or more layers and dielectric layer 304 disposed thereon. Via 310 may be formed within dielectric layer 304 by etching techniques or dielectric layer 304 may be deposited forming via 310. Via 310 extends through dielectric layer 304 to lower layer 302. Via 310 contains bottom surface 312 and wall surfaces 314. The field of substrate 300 extends across upper surface 316 of dielectric layer 304.

Tantalum-containing barrier layer 320 contains a tantalum carbide nitride material may be deposited or formed on substrate 300 by employing the deposition processes described herein, such as thermal decomposition, CVD, pulsed-CVD, PE-CVD, ALD, or PE-ALD. The tantalum carbide nitride material may be deposited to form tantalum-containing barrier layer 320 having a thickness within a range from about 3 Å to about 200 Å, preferably, from about 5 Å to about 100 Å, and more preferably, from about 10 Å to about 50 Å.

Tantalum-containing barrier layer 320 may be directly deposited on upper surface 316, as depicted in FIG. 3. Alternatively, upper surface 316 may be pre-treated or have one or multiple layers deposited thereon, prior to the deposition of tantalum-containing barrier layer 320 (not shown). For example, an adhesion layer or a nucleation layer may be deposited between upper surface 316 and tantalum-containing barrier layer 320. Also, additional barrier layers, nucleation layers, or seed layers, may be deposited onto tantalum-containing barrier layer 320 prior to depositing metal layer 322 (not shown). An adhesion layer, a nucleation layer, a seed layer, or an additional barrier layer may contain titanium, tantalum, tungsten, cobalt, ruthenium, nitrides thereof, silicides thereof, or alloys thereof and may be formed by a deposition process such as ALD, CVD, or PVD. Tantalum-containing barrier layer 320 may serve as a seed layer to promote the formation of metal layer 322 using, for example, electroplating or ALD techniques. Important characteristics that tantalum-containing barrier layer 320 should demonstrate include good step coverage, thickness uniformity, high electrical conductivity, and ability to prohibit copper diffusion.

In one example, tantalum-containing barrier layer 320 is formed from tantalum carbide nitride material by sequentially exposing substrate 300 to a tantalum precursor and at least another precursor during an ALD process. Although not required, tantalum-containing barrier layer 320 may contain monolayers of multiple compounds, such as tantalum carbide nitride, tantalum carbide nitride, and tantalum metal. Tantalum-containing barrier layer 320 conforms to the profile of via 310 so as to cover bottom surface 312 and wall surface 314, as well as across upper surface 316 of dielectric layer 304.

Metal layer 322 fills via 310 while being deposited over tantalum-containing barrier layer 320. Metal layer 322 may contain a conductive metal that includes copper, tungsten, aluminum, tantalum, titanium, ruthenium, silver, alloys thereof, or combinations thereof. The deposition process used to form metal layer 322 may include CVD, PVD, electroless plating, electroplating, or combinations thereof. Also, metal layer 322 may include a combination of layers made by various deposition processes, such as a seed layer formed by an ALD process and a bulk layer or fill layer by a CVD process.

In one example, metal layer 322 contains a copper-containing seed layer deposited by PVD, electroless plating, or electroplating and a copper-containing bulk layer deposited by CVD, electroless plating, or electroplating. In another example, metal layer 322 contains a ruthenium-containing seed layer deposited by ALD, PVD, electroless plating, or electroplating and a copper-containing bulk layer deposited by CVD, electroless plating, or electroplating. In another example, metal layer 322 contains a tungsten-containing seed layer deposited by ALD, CVD, or PVD and a tungsten-containing bulk layer deposited by CVD.

In an alternative embodiment, TBTEMT may be used as a tantalum precursor to form other ternary tantalum-containing materials, such as tantalum silicon nitride, tantalum boron nitride, tantalum phosphorous nitride, tantalum oxynitride or tantalum silicate. A more detailed description of a process to form ternary or quaternary elemental tantalum-containing materials is described in commonly assigned U.S. Pat. No. 7,081,271, which is incorporated herein in its entirety by reference.

In other examples, metal gate applications for tantalum carbide nitride material may be deposited by deposition processes described herein. The deposition processes preferably utilize TBTEMT as a tantalum precursor gas. The gate layer may contain a gate material such as silicon oxynitride, hafnium oxide, aluminum oxide or combinations thereof. A tantalum carbide nitride materials or a tantalum silicon nitride material is deposited on the gate layer by the vapor deposition processes described herein. Generally, the tantalum carbide nitride material is deposited on a gate layer with a thickness within a range from about 20 Å to about 200 Å, preferably, about 40 Å. Subsequently, a metal-containing layer is deposited on the tantalum carbide nitride material. Metal-containing layers may contain titanium, titanium nitride, tungsten, tantalum, ruthenium or combinations thereof and are deposited by CVD, ALD, PVD, electrochemical plating, or electroless plating processes. In one example, the metal-containing layer is titanium nitride deposited by a CVD process, an ALD process, or a PVD process. In another example, the metal-containing layer is tungsten deposited by a CVD process. In another example, the metal-containing layer is tantalum deposited by a PVD process or an ALD process using TBTEMT as described herein. In another example, the metal-containing layer is ruthenium deposited by an ALD process.

A detailed description for an ALD process and an ALD deposition chamber that may be used with TBTEMT during the deposition process described herein, are further described in commonly assigned U.S. Pat. No. 6,916,398, and U.S. Ser. No. 10/281,079, filed Oct. 25, 2002, and published as US 2003-0121608, which are herein incorporated by reference in their entirety. In another embodiment, a PE-ALD process and a PE-ALD deposition chamber that may be used with TBTEMT during the deposition process described herein, are further described in commonly assigned U.S. Pat. No. 6,998,014, as well as U.S. Ser. No. 11/556,745, filed Nov. 6, 2006, and published as U.S. Pub. No. 2007-0119370, and U.S. Ser. No. 11/556,763, filed Nov. 6, 2006, and published as U.S. Pub. No. 2007-0128864, which are herein incorporated by reference in their entirety. A detailed description for a vaporizer or an ampoule to pre-heat precursors, such as TBTEMT, is described in commonly assigned U.S. Pat. Nos. 6,905,541, 6,915,592, and 7,186,385, as well as U.S. Ser. No. 10/590,448, filed Aug. 24, 2006, and published as U.S. Pub. No. 2007-0067609, and U.S. Ser. No. 11/246,890, filed Oct. 7, 2005, and published as U.S. Pub. No. 2007-0079759, which are herein incorporated by reference in their entirety. A detailed description for a system to deliver the precursors, such as TBTEMT, to process chamber is described in commonly assigned U.S. Pat. No. 6,955,211, and U.S. Ser. No. 10/700,328, filed Nov. 3, 2003, and published as U.S. Pub. No. 2005-0095859, which are herein incorporated by reference in their entirety.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Embodiments of the processes described herein may be utilized to deposit tantalum carbide nitride materials, tantalum nitride materials, derivatives thereof, alloys thereof, and other tantalum-containing materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pretreatment process to polish, etch, reduce, oxidize, hydroxylate, anneal, and/or bake the substrate surface.

EXAMPLES

Tantalum-containing materials, such as the tantalum carbide nitride materials described herein, may be formed by the variety of deposition processes in the following actual and hypothetical Examples 1-11. The deposition of the tantalum carbide nitride materials, layers, or films may be used for metal gate electrodes, barrier layers, adhesion layers, and as other components used in various Logic, Flash, and DRAM applications, as well as in contact application.

The TBTEMT precursor may be heated in a vaporizer, a bubbler or an ampoule prior to flowing into the deposition chamber. The TBTEMT may be heated to a temperature of at least about 50° C., preferably, of at least about 60° C., more preferably, from about 65° C. to about 90° C. The preheated TBTEMT precursor is retained in the carrier gas more thoroughly than if the TBTEMT precursor was at room temperature. An exemplary substrate temperature or substrate pedestal during the deposition process is within a range from about 250° C. to about 600° C., preferably, from about 350° C. to about 550° C., and more preferably, from about 400° C. to about 500° C. The deposition chamber regional varies, but has a similar temperature to that of the substrate temperature. The deposition chamber has a controlled environment that is pressurized within a range from about 1 mTorr to about 100 Torr, preferably, from about 1 Torr to about 10 Torr, and more preferably, from about 2 Torr to about 5 Torr. In other examples, it should be understood that other temperatures and pressures may be used during the process described herein.

Example 1

Thermal Decomposition

A tantalum carbide nitride material was deposited on a substrate by a thermal decomposition process by heating the substrate and the substrate pedestal to a temperature of about 425° C. The substrate was exposed to a tantalum precursor gas at a flow rate of about 500 sccm, of which, contained about 100 sccm of TBTEMT and about 400 sccm of argon carrier gas. The substrate was not exposed to a nitrogen-containing gas, such as ammonia. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.75:0.31. The XPS analysis of the tantalum carbide nitride material revealed the two different binding sites for carbon, indicative to the interstitial carbon and the elemental carbon. An interstitial/elemental carbon ratio was deduced from the XPS spectra. Therefore, the tantalum carbide nitride material had an interstitial/elemental carbon ratio of about 1.69 per XPS analysis.

Example 2

Thermal Decomposition

A tantalum carbide nitride material was deposited on a substrate by a thermal decomposition process by heating the substrate and the substrate pedestal to a temperature of about 475° C. The substrate was exposed to a tantalum precursor gas at a flow rate of about 500 sccm, of which, contained about 100 sccm of TBTEMT and about 400 sccm of argon carrier gas. The substrate was not exposed to a nitrogen-containing gas, such as ammonia. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.88:0.38. The tantalum carbide nitride material had an interstitial/elemental carbon ratio of about 2.44 per XPS analysis.

Example 3

Thermal Decomposition

A tantalum carbide nitride material was deposited on a substrate by a thermal decomposition process by heating the substrate and the substrate pedestal to a temperature of about 495° C. The substrate was exposed to a tantalum precursor gas at a flow rate of about 500 sccm, of which, contained about 100 sccm of TBTEMT and about 400 sccm of argon carrier gas. The substrate was not exposed to a nitrogen-containing gas, such as ammonia. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.88:0.38. The tantalum carbide nitride material had an interstitial/elemental carbon ratio of about 3.65 per XPS analysis.

Example 4

Thermal Decomposition

A tantalum carbide nitride material was deposited on a substrate by a thermal decomposition process by heating the substrate and the substrate pedestal to a temperature of about 495° C. The substrate was exposed to ammonia gas at a flow rate of about 100 sccm. The substrate was also exposed to a tantalum precursor gas at a flow rate of about 500 sccm, of which, contained about 100 sccm of TBTEMT and about 400 sccm of argon carrier gas. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.40:0.44.

Example 5

Thermal Decomposition

A tantalum carbide nitride material was deposited on a substrate by a thermal decomposition process by heating the substrate and the substrate pedestal to a temperature of about 495° C. The substrate was exposed to ammonia gas at a flow rate of about 500 sccm. The substrate was also exposed to a tantalum precursor gas at a flow rate of about 500 sccm, of which, contained about 100 sccm of TBTEMT and about 400 sccm of argon carrier gas. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.40:0.50.

Example 6

Thermal Decomposition

A tantalum carbide nitride material was deposited on a substrate by a thermal decomposition process by heating the substrate and the substrate pedestal to a temperature of about 495° C. The substrate was exposed to ammonia gas at a flow rate of about 1,000 sccm. The substrate was also exposed to a tantalum precursor gas at a flow rate of about 500 sccm, of which, contained about 100 sccm of TBTEMT and about 400 sccm of argon carrier gas. The tantalum carbide nitride material was deposited on the substrate to a final thickness of about 200 Å. The composition analysis of the tantalum carbide nitride material provided the respective atomic ratios of tantalum, carbon, and nitrogen to be 1.00:0.29:0.51.

Example 7

CVD

A tantalum carbide nitride material may be deposited on a substrate by a CVD process. The substrate and the substrate pedestal were heated to a temperature of about 450° C. The substrate was simultaneously exposed to ammonia gas and to a tantalum precursor gas of TBTEMT and argon for about 35 seconds. The plasma was ignited during the full exposure. The ammonia gas had a flow rate of about 1,500 sccm and the tantalum precursor gas had a flow rate of about 500 sccm, of which, contained about 100 sccm of TBTEMT and about 400 sccm of argon carrier gas. The tantalum carbide nitride material was deposited on the substrate to a final thickness of about 150 Å. The composition analysis of the tantalum carbide nitride material provided the respective atomic ratios of tantalum, carbon, and nitrogen to be 1.00:0.31:0.56.

Example 8

PE-CVD

A tantalum carbide nitride material may be deposited on a substrate by a PE-CVD process. The substrate and the substrate pedestal were heated to a temperature of about 490° C. The substrate was simultaneously exposed to ammonia gas and to a tantalum precursor gas of TBTEMT and argon for about 25 seconds. The ammonia gas had a flow rate of about 1,500 sccm and the tantalum precursor gas had a flow rate of about 500 sccm, of which, contained about 100 sccm of TBTEMT and about 400 sccm of argon carrier gas. The tantalum carbide nitride material was deposited on the substrate to a final thickness of about 150 Å. The composition analysis of the tantalum carbide nitride material provided the respective atomic ratios of tantalum, carbon, and nitrogen to be 1.00:0.28:0.54.

Example 9

Pulsed-CVD

A tantalum carbide nitride material may be deposited on a substrate by a pulsed-CVD process. The substrate and the substrate pedestal were heated to a temperature of about 490° C. The substrate was sequentially exposed to ammonia gas and to a tantalum precursor gas of TBTEMT and argon. The PE-ALD cycle exposed the substrate to the ammonia gas for about 3 seconds and the tantalum precursor gas for about 2 seconds. The ammonia gas had a flow rate of about 1,500 sccm and the tantalum precursor gas had a flow rate of about 500 sccm, of which, contained about 100 sccm of TBTEMT and about 400 sccm of argon carrier gas. The tantalum carbide nitride material was deposited on the substrate to a final thickness of about 130 Å. The composition analysis of the tantalum carbide nitride material provided the respective atomic ratios of tantalum, carbon, and nitrogen to be 1.00:0.22:0.48.

Example 10

ALD

A tantalum carbide nitride material may be deposited on a substrate by an ALD process. The substrate and the substrate pedestal were heated to a temperature of about 475° C. The substrate was sequentially exposed to ammonia gas, nitrogen purge gas, a tantalum precursor gas of TBTEMT and argon, and the nitrogen purge gas during an ALD cycle. The ALD cycle exposed the substrate to the ammonia gas for about 3 seconds, the tantalum precursor gas for about 2 seconds, and the nitrogen purge gas for about 3 seconds. The ammonia gas had a flow rate of about 1,000 sccm and the tantalum precursor gas had a flow rate of about 500 sccm, of which, contained about 100 sccm of TBTEMT and about 400 sccm of argon carrier gas. The tantalum carbide nitride material was deposited on the substrate to a final thickness of about 20 Å. The composition analysis of the tantalum carbide nitride material provided the respective atomic ratios of tantalum, carbon, and nitrogen to be 1.00:0.25:0.53.

Example 11

PE-ALD

A tantalum carbide nitride material may be deposited on a substrate by a PE-ALD process. The substrate and the substrate pedestal were heated to a temperature of about 450° C. The substrate was sequentially exposed to ammonia gas, nitrogen purge gas, a tantalum precursor gas of TBTEMT and argon, and the nitrogen purge gas during a PE-ALD cycle. The PE-ALD cycle exposed the substrate to the ammonia gas for about 3 seconds, the tantalum precursor gas for about 2 seconds, and the nitrogen purge gas for about 3 seconds. The plasma was ignited during the ammonia exposure. The ammonia gas had a flow rate of about 1,000 sccm and the tantalum precursor gas had a flow rate of about 500 sccm, of which, contained about 100 sccm of TBTEMT and about 400 sccm of argon carrier gas. The tantalum carbide nitride material was deposited on the substrate to a final thickness of about 20 Å. The composition analysis of the tantalum carbide nitride material provided the respective atomic ratios of tantalum, carbon, and nitrogen to be 1.00:0.26:0.50.

Although the invention has been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the nitrogen-containing gas before the tantalum precursor gas is introduced into the processing chamber. In addition, the tantalum carbide nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the invention, other and further embodiments of the invention may be devised without departing from the basic scope thereof, and the scope thereof is determined by the claims that follow.

The invention claimed is:

1. A method for forming a tantalum-containing material on a substrate surface with a processing chamber, comprising:
   sequentially exposing the substrate surface to a nitrogen-containing gas and a process gas comprising a tantalum precursor gas and a carrier gas during an atomic layer deposition process; and
   depositing a tantalum carbide nitride material on the substrate during the atomic layer deposition process, wherein the tantalum carbide nitride material is crystalline, and comprises interstitial carbon and elemental carbon having an interstitial/elemental carbon atomic ratio of about 2 or greater and the tantalum carbide nitride material having the chemical formula of $TaC_xN_y$, wherein x is within a range from about 0.25 to about 0.40 and y is within a range from about 0.30 to about 0.50 and wherein a flow rate of the nitrogen-containing gas is adjusted to obtain the interstitial/elemental carbon atomic ratio, wherein the nitrogen-containing gas and the process gas comprising the tantalum precursor gas are exposed to the substrate at a gaseous flow rate ratio of at least about 1:1.

2. The method of claim 1, wherein the interstitial/elemental carbon atomic ratio is about 4 or greater.

3. The method of claim 1, further comprising heating the substrate to a temperature within a range from about 400° C. to about 500° C.

4. The method of claim 1, wherein the gaseous flow rate ratio is at least about 3:1.

5. The method of claim 4, wherein the gaseous flow rate ratio is at least about 5:1.

6. The method of claim 1, wherein the tantalum precursor gas comprises an alkylamido tantalum compound and the nitrogen-containing gas comprises a gas selected from the group of ammonia, hydrazine, methyl hydrazine, dimethyl hydrazine, t-butylhydrazine, phenylhydrazine, nitrogen gas, a mixture of nitrogen gas and hydrogen gas, 2,2'-azotertbutane (($CH_3$)$_6C_2N_2$), alkyl azides, inorganic azides, and combinations thereof.

7. The method of claim 6, wherein the nitrogen-containing gas comprises ammonia.

8. The method of claim 6, wherein the alkylamido tantalum compound is selected from the group consisting of tertbutylimido-tris(ethylmethylamido) tantalum (TBTEMT), tertbutylimido-tris(diethylamido) tantalum (TBTDEAT), tertbutylimido-tris(dimethylamido) tantalum (TBTDMAT), tertiaryamylimido-tris(dimethylamido) tantalum (TAIMATA), tertiaryamylimido-tris(diethylamido) tantalum, tertiaryamylimido-tris(methylethylamido) tantalum, pentakis(ethylmethylamido) tantalum (PEMAT), pentakis(diethylamido) tantalum (PDEAT), pentakis(dimethylamido) tantalum (PDMAT), plasmas thereof, derivatives thereof, and combinations thereof.

9. The method of claim 1, wherein the process gas further comprises a hydrocarbon gas selected from the group consisting of methane, ethane, propane, butane, ethene, acetylene, butene, butyne, plasmas thereof, derivatives thereof, and combinations thereof.

10. A method for forming a tantalum-containing material on a substrate surface within a processing chamber, comprising:
sequentially exposing the substrate to one or more cycles of a nitrogen-containing gas and a process gas comprising a tantalum precursor gas and a carrier gas during a plasma enhanced atomic layer deposition process; and
depositing a tantalum carbide nitride material on the substrate during the plasma enhanced atomic layer deposition process, wherein the tantalum carbide nitride material is crystalline, and comprises interstitial carbon and elemental carbon having an interstitial/elemental carbon atomic ratio of about 2 or greater and the tantalum carbide nitride material having the chemical formula of $TaC_xN_y$, wherein x is within a range from about 0.25 to about 0.40 and y is within a range from about 0.30 to about 0.50, and wherein the nitrogen-containing gas and the process gas comprising the tantalum precursor gas and a carrier gas are exposed to the substrate at a gaseous flow rate ratio of at least about 1:1.

11. The method of claim 10, wherein the interstitial/elemental carbon atomic ratio is about 4 or greater.

12. The method of claim 11, wherein a flow rate of the nitrogen-containing gas is adjusted to obtain the interstitial/elemental carbon atomic ratio.

13. The method of claim 10, further comprising heating the substrate to a temperature within a range from about 400° C. to about 500° C.

14. The method of claim 10, wherein the gaseous flow rate ratio is at least about 3:1.

15. The method of claim 10, wherein the tantalum precursor gas comprises an alkylamido tantalum compound and the nitrogen-containing gas comprises a gas selected from the group of ammonia, hydrazine, methyl hydrazine, dimethyl hydrazine, t-butylhydrazine, phenylhydrazine, nitrogen gas, a mixture of nitrogen gas and hydrogen gas, 2,2'-azotertbutane $((CH_3)_6C_2N_2)$, alkyl azides, inorganic azides, and combinations thereof.

16. The method of claim 15, wherein the nitrogen-containing gas comprises ammonia and the alkylamido tantalum compound is selected from the group consisting of tertbutylimido-tris(ethylmethylamido) tantalum (TBTEMT), tertbutylimido-tris(diethylamido) tantalum (TBTDEAT), tertbutylimido-tris(dimethylamido) tantalum (TBTDMAT), tertiaryamylimido-tris(dimethylamido) tantalum (TAIMATA), tertiaryamylimido-tris(d iethylam ido) tantalum, tertiaryamylim ido-tris(methylethylam ido) tantalum, pentakis(ethylmethylamido) tantalum (PEMAT), pentakis(diethylamido) tantalum (PDEAT), pentakis(dimethylamido) tantalum (PDMAT), plasmas thereof, derivatives thereof, and combinations thereof.

17. The method of claim 10, wherein the process gas further comprises a hydrocarbon gas selected from the group consisting of methane, ethane, propane, butane, ethene, acetylene, butene, butyne, plasmas thereof, derivatives thereof, and combinations thereof.

18. A method for forming a tantalum-containing material on a substrate surface within a processing chamber, comprising:
sequentially exposing the substrate surface to a nitrogen-containing gas and a process gas comprising a tantalum precursor gas and a carrier gas during an atomic layer deposition process, wherein the nitrogen-containing gas and the process gas comprising the tantalum precursor gas and a carrier gas are exposed to the substrate at a gaseous flow rate ratio of at least about 1:1; and
depositing a tantalum carbide nitride material on the substrate during the atomic layer deposition process, wherein the tantalum carbide nitride material is crystalline, and comprises interstitial carbon and elemental carbon having an interstitial/elemental carbon atomic ratio of about 2 or greater and the tantalum carbide nitride material having the chemical formula of $TaC_xN_y$, wherein x is within a range from about 0.20 to about 0.50 and y is within a range from about 0.20 to about 0.55 and wherein a flow rate of the nitrogen-containing gas is adjusted to obtain the interstitial/elemental carbon atomic ratio.

19. The method of claim 18, the tantalum carbide nitride material having the chemical formula of $TaC_xN_y$, wherein x is within a range from about 0.25 to about 0.40 and y is within a range from about 0.30 to about 0.5, wherein a flow rate of the nitrogen-containing gas is adjusted to obtain the interstitial/elemental carbon atomic ratio.

* * * * *

UNITED STATES PATENT AND TRADEMARK OFFICE
CERTIFICATE OF CORRECTION

| | | |
|---|---|---|
| PATENT NO. | : 7,989,339 B2 | |
| APPLICATION NO. | : 12/699271 | |
| DATED | : August 2, 2011 | |
| INVENTOR(S) | : Shah et al. | |

It is certified that error appears in the above-identified patent and that said Letters Patent is hereby corrected as shown below:

In the Claims:

Column 16, Claim 1, Line 31, please delete "with" and insert --within-- therefor;

Column 16, Claim 1, Line 44, please insert --,-- after 0.50

Column 18, Claim 16, Line 13, please delete "(d iethylam ido)" and insert --(diethylamido)-- therefor;

Column 18, Claim 16, Line 14, please delete "tertiaryamylim ido-tris" and insert --tertiaryamylimido-tris-- therefor;

Column 18, Claim 16, Line 14, please delete "(methylethylam ido)" and insert --(methylethylamido)-- therefor.

Signed and Sealed this
Twenty-fifth Day of October, 2011

David J. Kappos
*Director of the United States Patent and Trademark Office*